(12) United States Patent
Chickanosky et al.

(10) Patent No.: US 7,735,031 B2
(45) Date of Patent: Jun. 8, 2010

(54) METHOD AND APPARATUS FOR SELF IDENTIFICATION OF CIRCUITRY

(75) Inventors: Valerie Hornbeck Chickanosky, South Burlington, VT (US); Kevin William Gorman, Fairfax, VT (US); Emory D. Keller, Milton, VT (US); Michael Richard Ouellette, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 11/841,125

(22) Filed: Aug. 20, 2007

(65) Prior Publication Data

US 2009/0052609 A1 Feb. 26, 2009

(51) Int. Cl.
*G06F 17/50* (2006.01)

(52) U.S. Cl. .................. 716/4; 716/1; 716/5; 716/6; 716/16; 716/18; 703/13; 703/14; 703/15; 703/16; 377/26; 377/27; 377/28; 377/29; 377/30; 377/37; 377/44; 377/45; 377/46; 712/225; 712/226; 712/227; 365/201; 365/236

(58) Field of Classification Search ............... 716/1, 716/4–6, 16–18; 703/13–16; 377/26–30, 377/37–46; 712/225–227; 365/201, 236
See application file for complete search history.

(56) References Cited

U.S. PATENT DOCUMENTS

| 6,580,378 | B1 | 6/2003 | Lovell | |
|---|---|---|---|---|
| 6,615,325 | B2 * | 9/2003 | Mailloux et al. | ............ 711/154 |
| 6,819,598 | B2 | 11/2004 | Yamazaki et al. | |
| 7,028,206 | B2 * | 4/2006 | Waller | ........................ 713/400 |

\* cited by examiner

*Primary Examiner*—Jack Chiang
*Assistant Examiner*—Nghia M Doan
(74) *Attorney, Agent, or Firm*—W. Riyon Harding

(57) ABSTRACT

A system that includes a controller for enabling an enumeration operation. The enumeration operation is performed by a controller (110) and logic elements (120) in a system, such that each logic element in the system assigns itself a unique identifier. Each logic element can then be controlled by another source or have a means to communicate with other logic elements in the system. The unique identifier enables greater system flexibility, thereby reducing cost and improving efficiency.

17 Claims, 8 Drawing Sheets

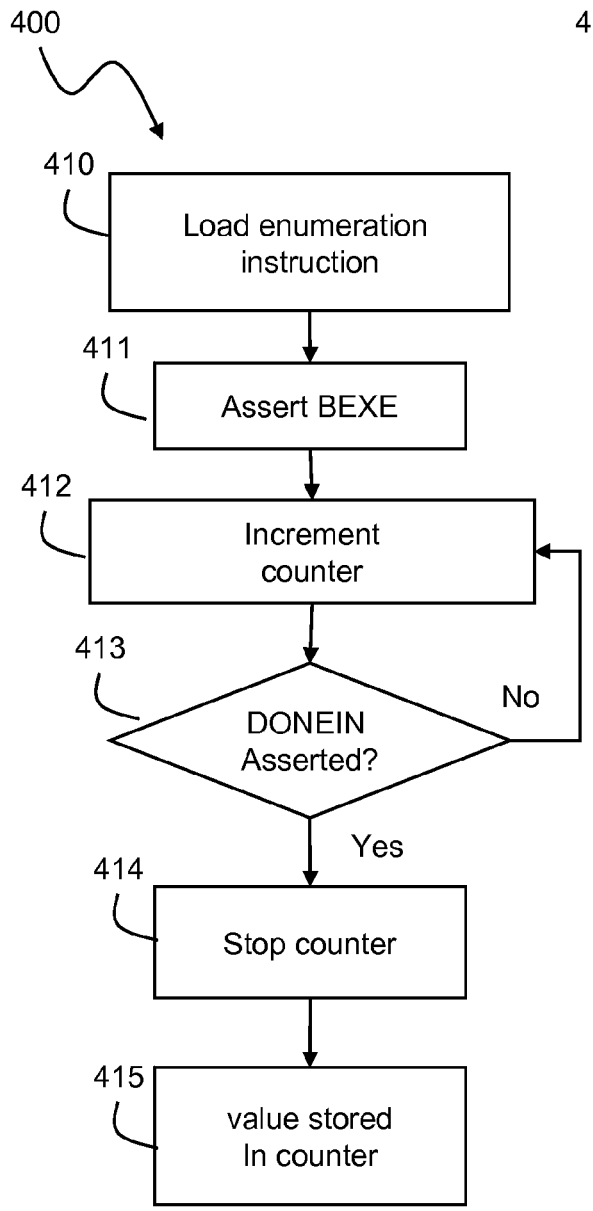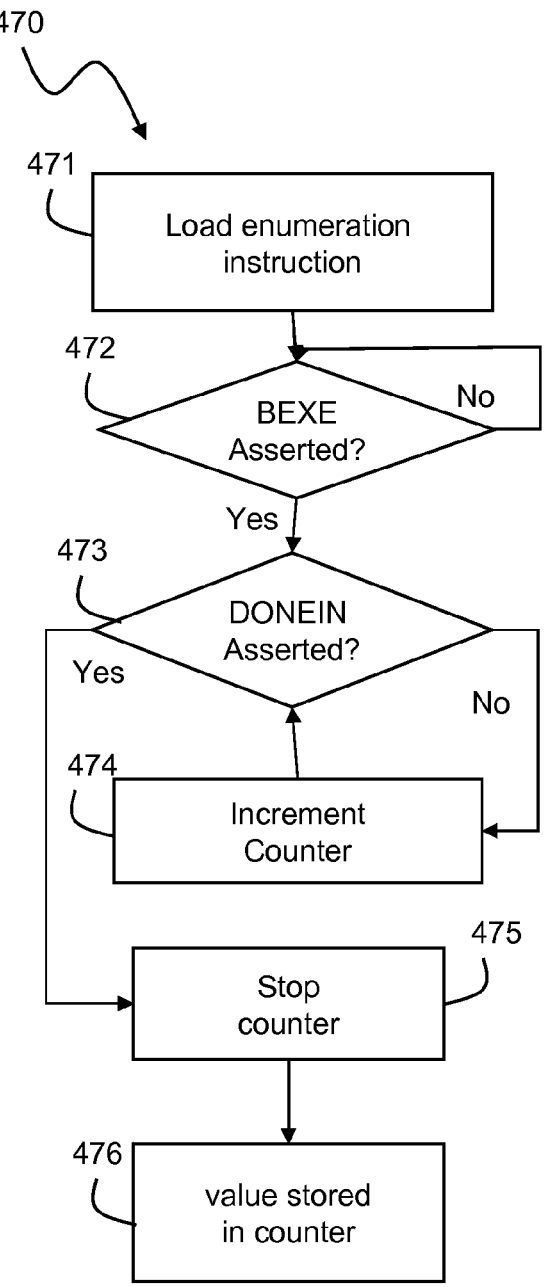
Fig. 4a
Fig. 4b

METHOD AND APPARATUS FOR SELF IDENTIFICATION OF CIRCUITRY

BACKGROUND OF THE INVENTION

1. Field of the Invention

The present invention generally relates to a means of generating unique identifiers using hardware such that multiple hardware resources can possess a means to communicate and/or be controlled by another source.

With the proliferation of electronic circuitry comes more complex and intricate systems composed of many different circuits that must work together to accomplish a task. Often such parameters as speed and cost drive the system designs. Reliability, resource usage, and flexibility of the systems are also factors that contribute to design.

For example, in the semiconductor manufacturing industry, test systems are a very large component of cost. Testing is typically time consuming, and requires specific equipment, overhead, and resources. Furthermore, testing varies from IC design to IC design, requiring more system flexibility. Current testing systems, formats and infrastructure do not efficiently accommodate such a wide variety of required tests.

2. Brief Summary of the Invention

An embodiment described herein provides a flexible system, which, for example, reduces power consumption during test, enables modification of test specifications to improve yield, and reduced pin count diagnostic operations, as well as other advantages not listed here but as can be appreciated by one of ordinary skill in the art.

The system includes a controller for enabling an enumeration operation, and at least one logic element. Multiple circuits under test (CUT) are coupled to logic elements, which execute the testing operations according to test data structures (e.g. files, patterns, etc.).

Each logic element has a unique ID that it assigns to itself when given the enumeration command by the controller (generally at power up). Typically the enumeration command is performed only once but is not limited to a single run. The system performs tests on the CUTs by instructing the controller and the logic elements. Tests can be performed by all logic elements, a subset of logic elements, or a single logic element. For example, the system can issue a command to test all of the SRAM CUTs by specifying that the logic elements coupled to SRAM CUTs are to perform the test. Likewise, the system may perform a test operation on a CUT or CUTs controlled by a single logic element.

The system provides greater flexibility in the test environment. For example, the system provides: power savings by testing only CUTs that require a given test operation; the ability to adjust margins for specific CUTs that will normally operate at slower speeds; a diagnostic mode such that select logic elements are adjusted to collect diagnostic information such as, for example, bit fail maps.

BRIEF DESCRIPTION OF THE DRAWINGS

FIG. 4a shows a flow diagram of a method of performing an enumeration operation by the controller in accordance with an embodiment;

FIG. 4b shows a flow diagram of a method of performing an enumeration operation by the logic element in accordance with an embodiment;

DETAILED DESCRIPTION

Figure 1:
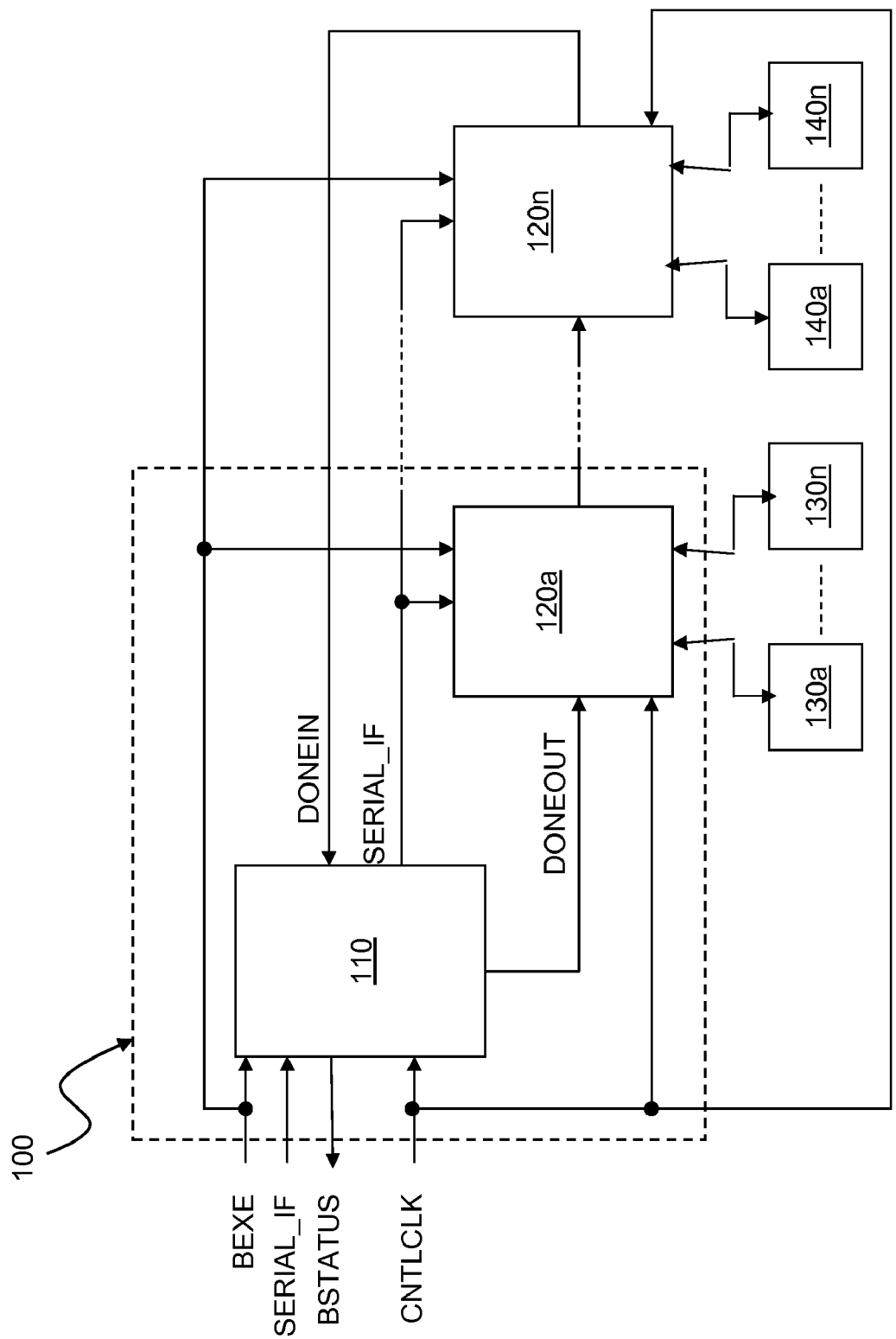
FIG. 1 shows a block diagram of a test structure in accordance with an embodiment.

FIG. 1 shows a system which includes a circuit 100. Circuit 100 further includes a controller 110 and a logic element 120a. Circuit 100 may include any number of logic elements 120 (shown in FIG. 1 as 120a-120n, where 'n' represents any whole number of logic elements). Circuits under test (CUTs) 130 are coupled to and tested by logic element 120a. Any number of CUTs may be coupled to one or more logic elements 120, for the sake of illustration FIG. 1 shows CUTs 130a-130n, where 'n' is any number of CUTs 130, coupled to logic element 120a and CUTs 140a-n are coupled to logic element 120n. CUTs 130 and 140 represent any type of circuit. For example, circuits may include but are not limited to: SRAM elements, PLLs, DRAM elements, etc.

Controller 110 accepts inputs such as a clock signal (CNTLCLK), an instruction signal (SERIAL_IF), an execute signal (BEXE), and a control signal (DONEIN). Controller 110 outputs a pulsed signal (DONEOUT), and a status signal (BSTATUS). The signal names are for illustrative purposes only and are meant to clarify the explanation of the embodiment. One of ordinary skill in the art would appreciate that other signals and signal names may be used without deviating from the scope and spirit of the embodiment. A detailed explanation of controller 110 and logic element 120 follows.

Figure 2:
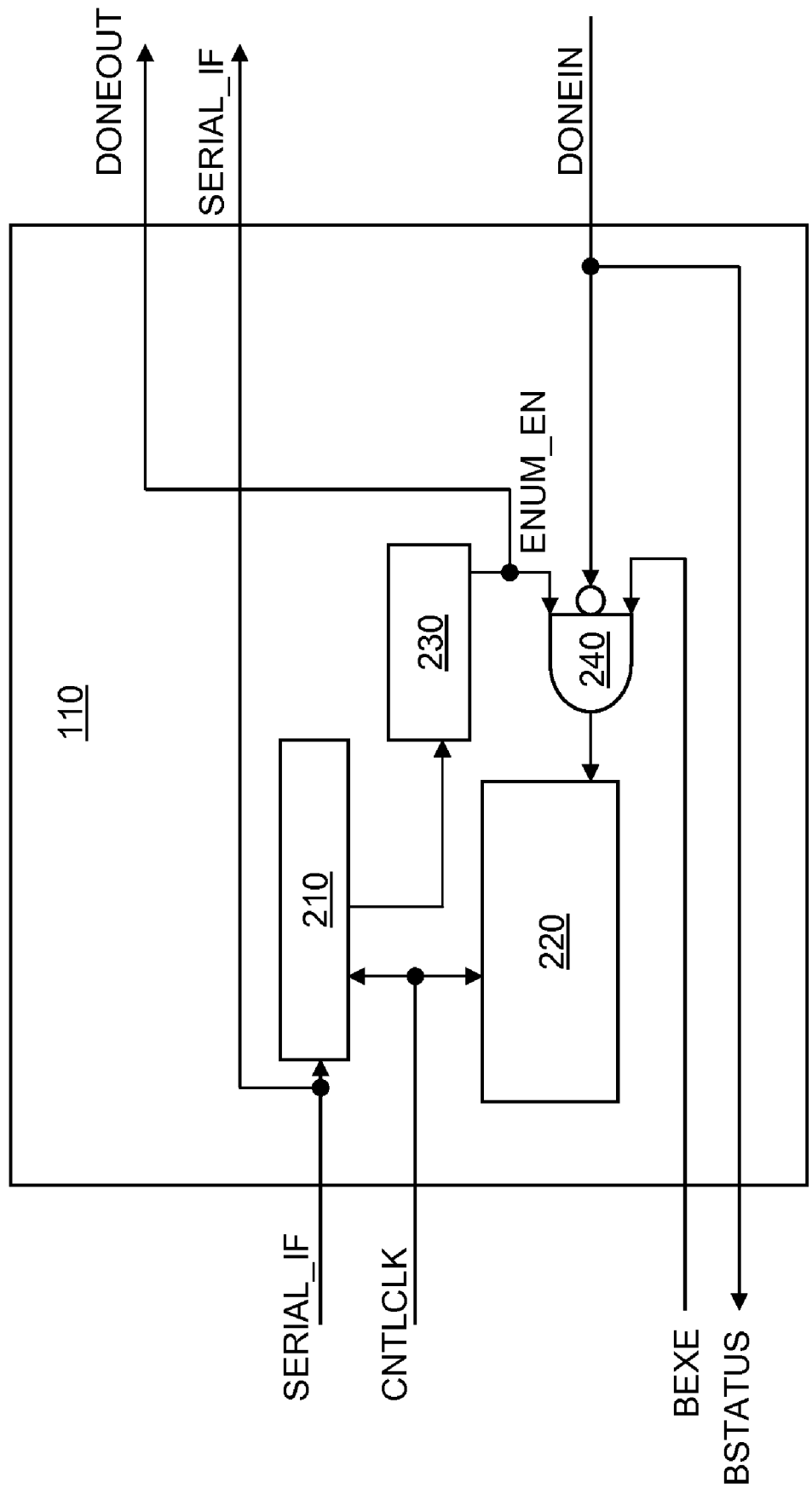
FIG. 2 shows a detailed block diagram of a controller in accordance with an embodiment.

FIG. 2 shows a more detailed schematic block diagram representative of controller 110. Controller 110 further includes a register 210, coupled to a decoder 230, which is further coupled to an enable element 240, and a counter 220.

In operation, register 210 receives and stores an instruction on the SERIAL_IF input. Register 210 forwards the instruction to decoder 230. Decoder 230 determines the instruction type (e.g. enumeration, read, write, or run) and an enable mode (i.e. addressing mode) for execution. If the instruction is an enumeration instruction, decoder 230 asserts a signal to enable element 240 (ENUM_EN) and a signal output onto DONEOUT, which, for example, is held to a logical '1' throughout the execution of the enumeration instruction. One of ordinary skill in that art can appreciate that other signaling schemes may be used to accomplish the same objective without deviating from the embodiment.

Once BEXE is asserted by the system, counter 220 begins to increment once every clock cycle (for this example), until DONEIN is asserted.

When DONEIN is asserted, counter 220 stops. The value in counter 220 is equal to the number of logic elements 120 in the system, which is useful during various diagnostic operations. When DONEIN is asserted, BSTATUS is also asserted, notifying the system that the enumeration operation is complete.

Figure 3:
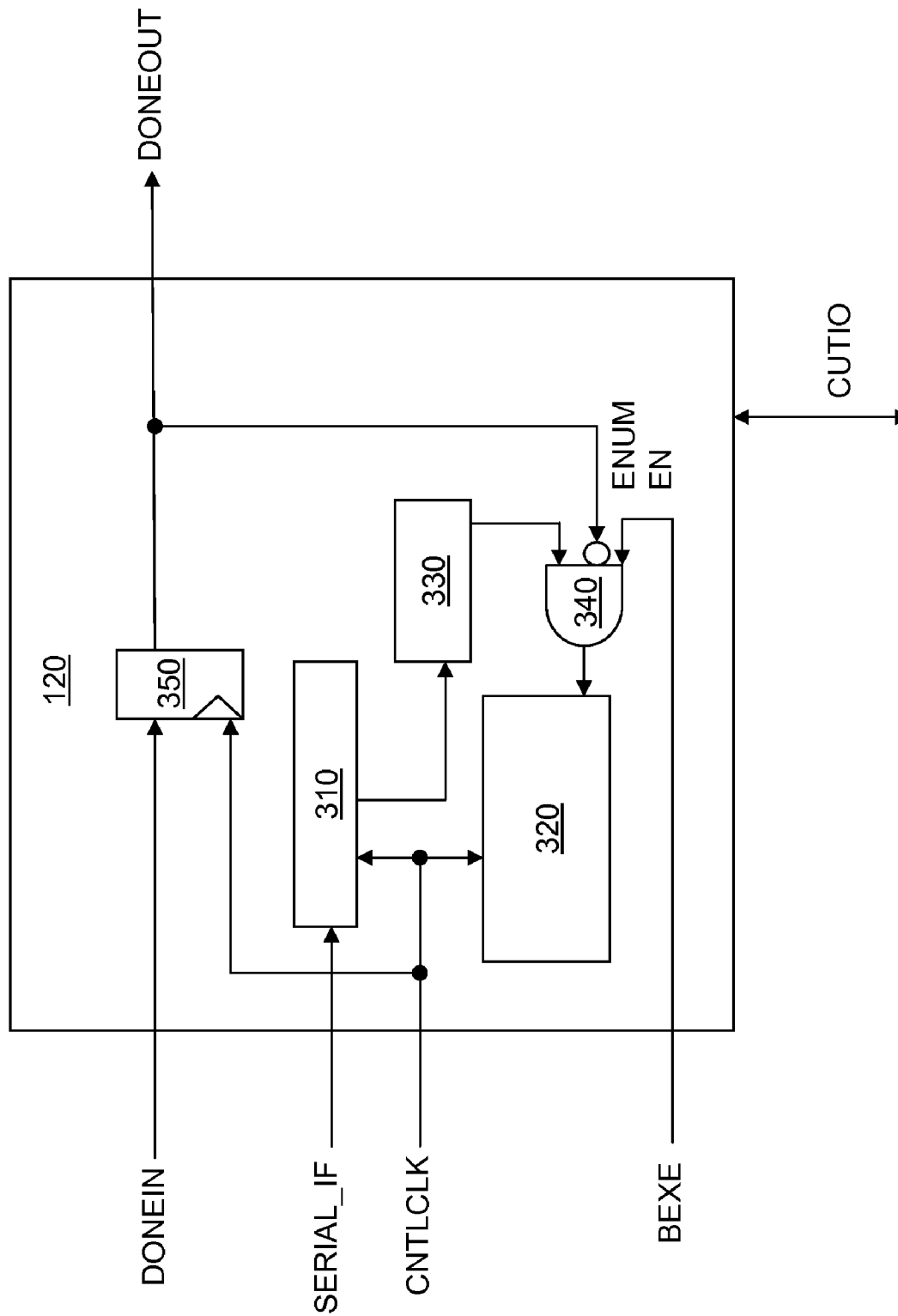
FIG. 3 shows a block diagram of a logic element in accordance with an embodiment.

FIG. 3 shows a detailed schematic block diagram of logic element 120. Logic element 120 includes a register 310 coupled to a decoder 330, which is further coupled to an enable element 340 and a counter 320. Register 310 accepts an instruction input from SERIAL_IF, which is decoded in decoder 330. Logic element 120 further includes a device 350 which accepts an input DONEIN and provides an output DONEOUT. DONEOUT is also coupled to an input of enable element 340. During an enumeration operation (as specified by the instruction in register 310), decoder 330 asserts a signal on the input of enable element 340 and the system asserts BEXE, which instructs counter 320 to begin incrementing. When DONEOUT becomes asserted, enable element 340 stops counter 320. The count value stored in counter 320 represents an identifier for logic element 120. The identifier is then used for directed testing purposes and allows the system to instruct that logic element (e.g. logic element 120) to perform operations such as reading or writing a control register (see FIG. 5) or performing a test on its respective CUTs (e.g. 130a-130n) through bus CUTIO.

FIG. 4a shows an example method 400 of performing an enumeration operation in controller 110 according to an embodiment.

In step 410, the system loads an enumeration instruction in register 210 and decodes the instruction in decoder 230. In step 411, the system asserts BEXE. In step 412 counter 220 is enabled by enable logic 240, BEXE, and DONEOUT, and begins to increment. In decision step 413 method 400 determines whether the DONEIN signal is asserted; if yes method 400 proceeds to step 414, if no, method 400 returns to step 412. In step 414, enable logic 240 disables counter 220. In step 415, the value stored in counter 220 represents the total number of logic elements 120 in the system.

FIG. 4b shows an example method 470 of performing an enumeration operation in any of logic elements 120 according to an embodiment.

In step 471 register 310 loads an instruction from SERIAL_IF and decoder 330 decodes the instruction. In decision step 472, method 470 determines whether BEXE is asserted; if no, method 470 waits until it is asserted, if yes, method 470 proceeds to decision step 473. In decision step 473, method 470 determines whether the DONEIN signal is asserted; if yes, method 470 proceeds to step 475, if no, method 470 proceeds to step 474. In step 474, enable logic 340 enables counter 320 and counter 320 begins to increment. At each clock cycle method 470 assesses whether DONEIN is asserted. In step 475, enable logic 340 disables counter 320. In step 476, the final counter value stored in counter 320 becomes the unique identifier value (ID) for that particular logic element 120.

Figure 5:
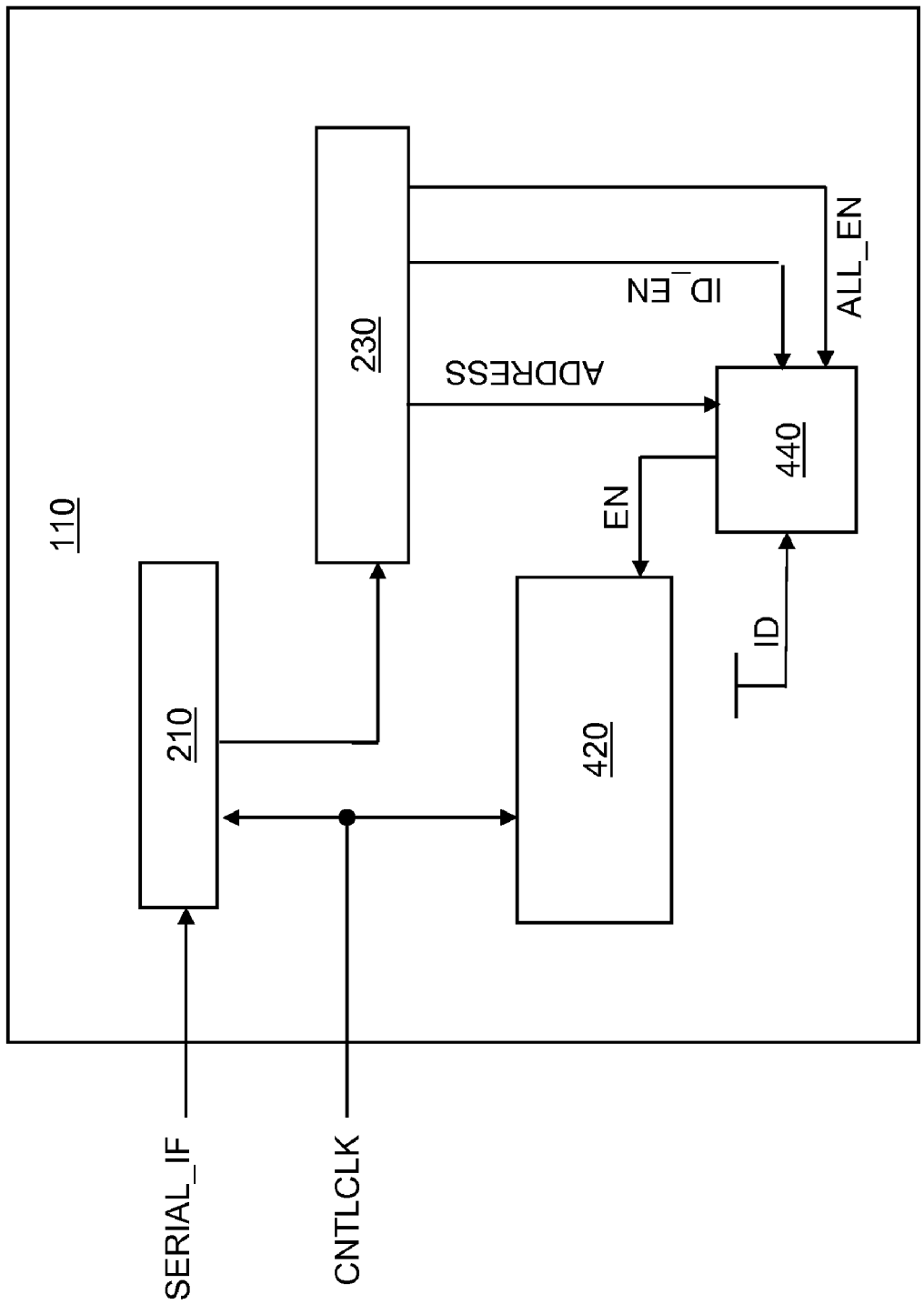
FIG. 5 shows a detailed block diagram of a controller in accordance with another embodiment.

FIG. 5 shows a detailed schematic block diagram of another embodiment of controller 110. In this embodiment, controller 110 includes a control register 420 coupled to an enable logic 440, which is further coupled to decoder 230. In this embodiment, decoder 230 determines whether the instruction from register 210 is directed to all logic elements 120 or a unique logic element 120. Enable logic 440 compares the identifier value (ID) (shown here to be hard wired for controller 110) with ADDRESS if ID_EN is asserted. If equivalent, enable logic 440 enables control register 420. For example, the instruction may execute a read operation from control register 420 or perform a write operation to control register 420. Enable logic 440 enables control register 420 for operation if ALL_EN is asserted.

Special ID's may be reserved for controller 110. For example, the ID "FFF" may be recognized in enable logic 440 as pertaining to controller 110, thus enabling control register 420. This 'reserved address' as it is referred to in the industry, may be hardwired or provided in software.

Figure 6:
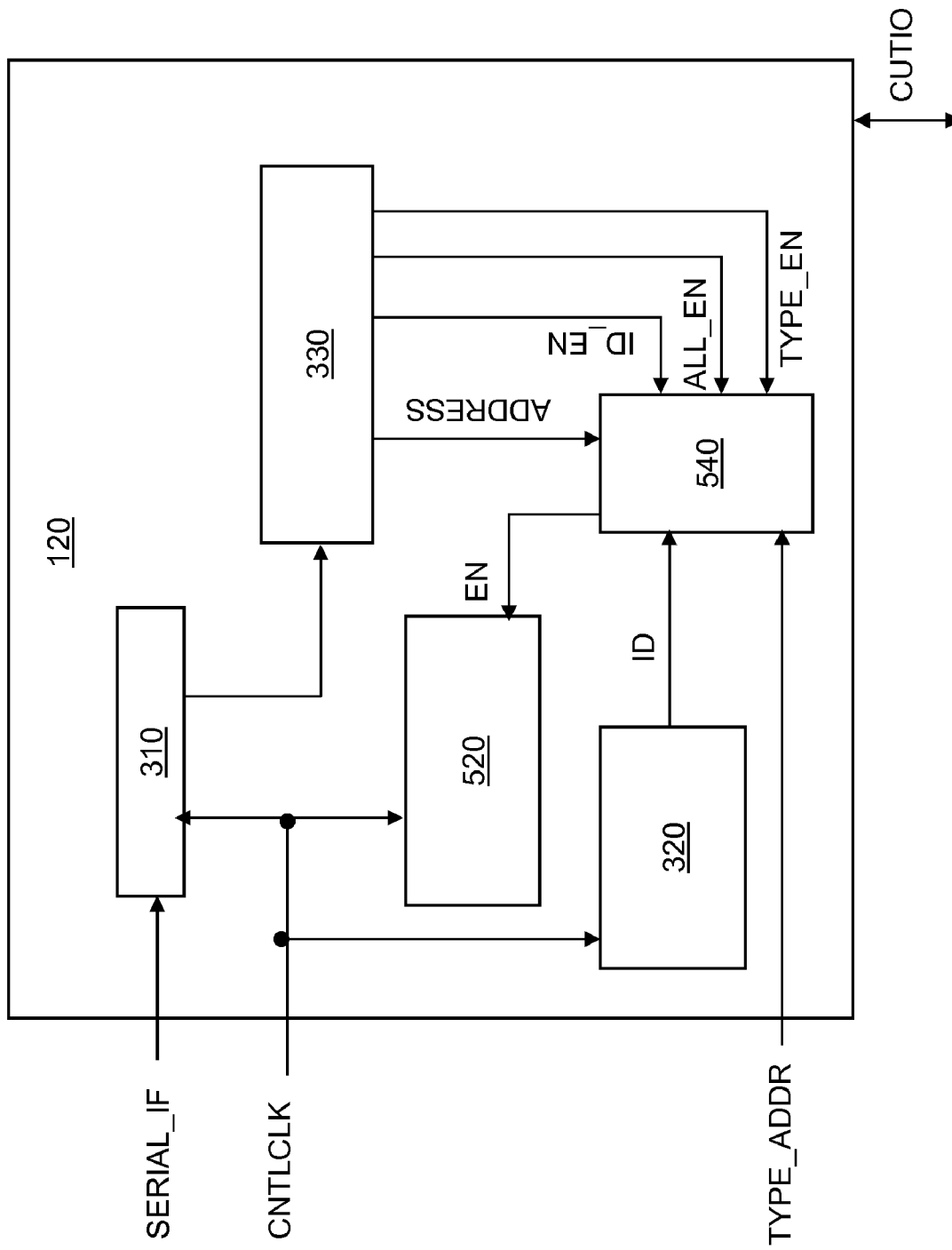
FIG. 6 shows a block diagram of a logic element in accordance with another embodiment.

FIG. 6 shows a detailed schematic block diagram of another embodiment of logic element 120. In this embodiment, logic element 120 includes an enable logic 540 which is coupled to decoder 330 and a control register 520. Enable logic 540 further includes both an input from counter 320 which provides the identifier value (ID) of that logic element 120 and a TYPE_ADDR signal which provides an identifier for a subset of logic elements 120. For example, TYPE_ADDR may represent a value corresponding to logic elements 120 that control SRAM CUTs. In operation decoder 330 decodes an instruction stored in register 310. Decoder 330 asserts a signal corresponding to the enablement mode. For example, an instruction for all logic elements 120 corresponds to asserting the ALL_EN signal, an instruction for only a certain subset of logic elements 120 corresponds to asserting the TYPE_EN signal, or an instruction for one specific logic element 120 corresponds to asserting the ID_EN signal. Enable logic 540 compares the TYPE_ADDR value with a TYPE value provided by the instruction if the TYPE_EN signal is enabled via the ADDRESS signal. Similarly, if the ID_EN signal is asserted, enable logic 540 compares the ID value from counter 320 with the ID value specified in the instruction via the ADDRESS signal. If there is a match, enable logic 540 enables control register 520. When control register 520 is enabled, the system can perform, for example, read and/or write operations on control register 520. Other operations are also possible with this embodiment. Likewise, if the ALL_EN signal is asserted then enable logic 540 asserts the enable signal EN for control register 520.

Reserved IDs (aka reserved addresses) may also be implemented for logic elements 120. For example, the ID "000" may be recognized in enable logic 540 as pertaining to its logic element 120, thus enabling control register 520. Regardless of the ID value stored in counter 320. The reserved ID may be hardwired or provided in software. As can be appreciated by one of ordinary skill, the list of reserved addresses and their associated logic elements 120 may be adapted to efficiently accomplish any given function or task. In this embodiment, logic elements 120 need not possess a counter 320 to operate.

Figure 7:
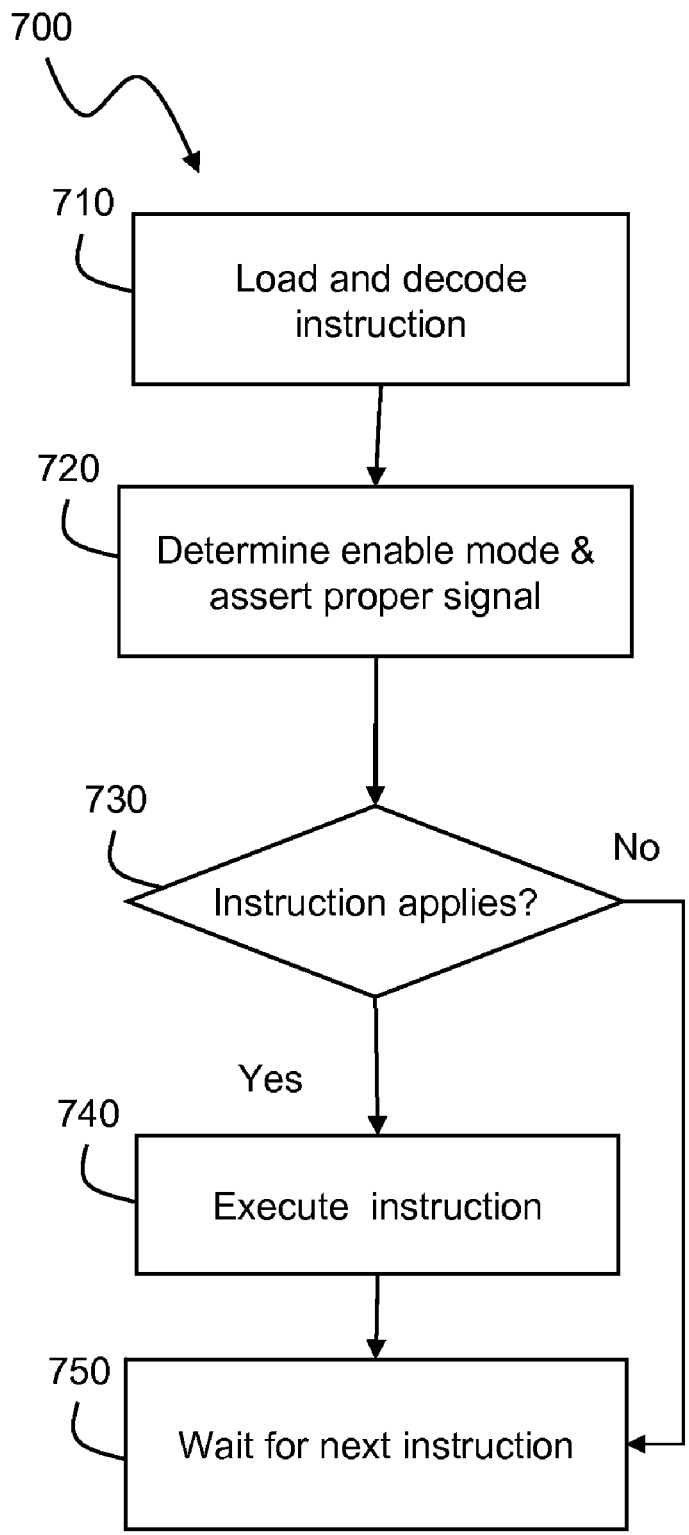
FIG. 7 shows a flow diagram of a method of operating the test structure in accordance with an embodiment.

FIG. 7 shows a flow diagram of a method 700. Method 700 is an example method of operating circuit 100. One of ordinary skill in the art will appreciate that there are other method which could be implemented to achieve the same or similar results without deviating from the scope or spirit of the example embodiment.

In step 710, an instruction is loaded into registers 210 and 310 of controller 110 and at least one logic element 120, respectively. Decoders 230 and 330 decode the instruction and assert respective enable signal depending on the enable mode indicated in the instruction. For example, for an instruction directed towards all logic elements 120, decoders 230 and 330 would assert the ALL_EN signal. Similarly, an instruction intended for a specific logic element 120 or controller 110 results in assertion of the ID_EN signal respectively.

In decision step 730, method 700 determines whether the instruction applies to the particular logic element 120 and/or controller 110 by comparing the ID value from the instruction with the respective ID values or Type values. For instructions that are directed to all logic elements method 700 determines that the instruction applies and proceeds to step 740. If the instruction does not apply, then method 700 proceeds to step 750, where method 700 waits for the next instruction.

In step 740, the corresponding logic elements 120 and/or controller 110 execute the instruction. For example, the instruction may be to execute a built-in-self-test (BIST) on a group of SRAM elements on a specific integrated circuit (IC) using a test pattern which was generated from the control registers 420 of respective logic elements 120 via previous instructions. Method 700 then proceeds to step 750.

Figure 8:
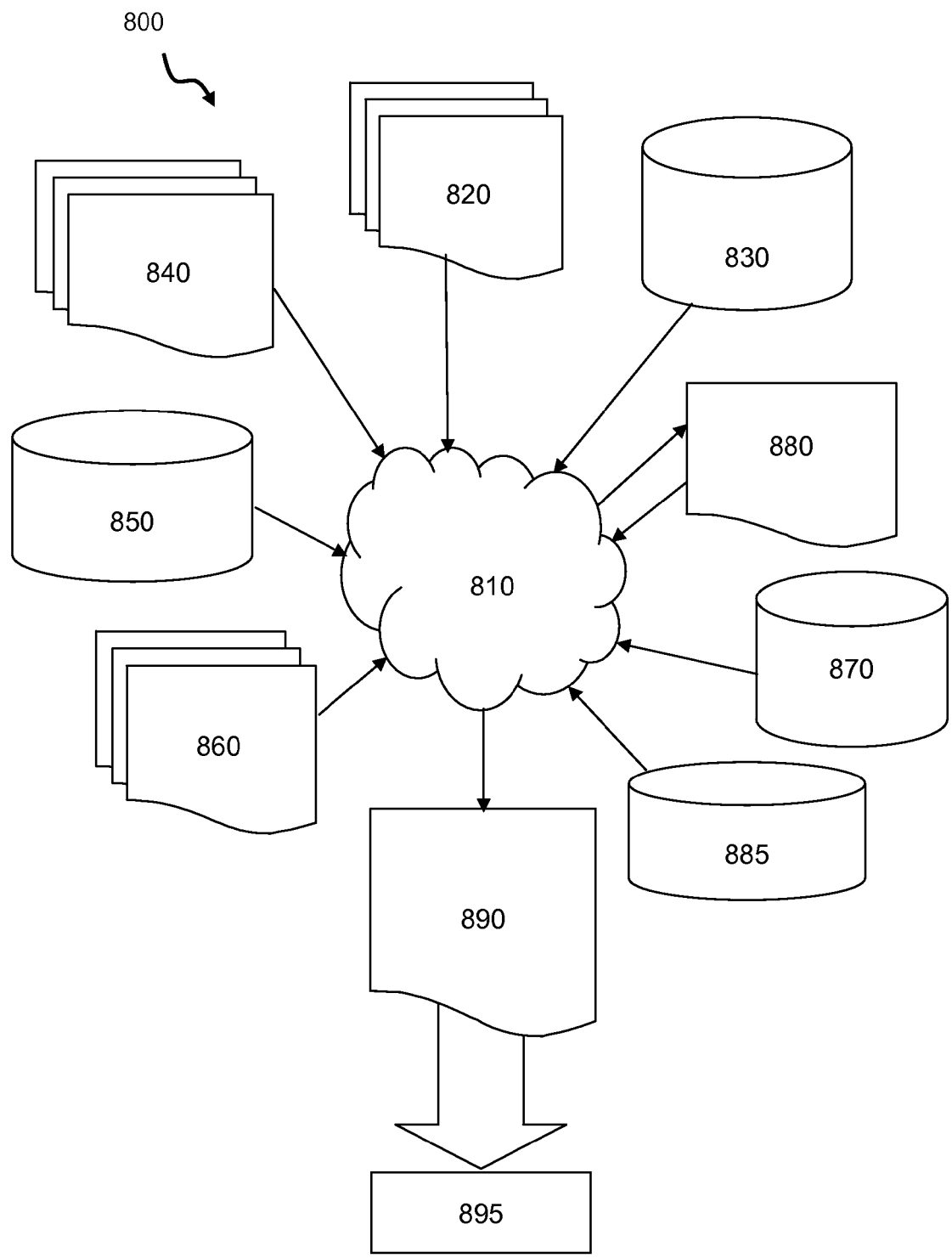
FIG. 8 shows a detailed block diagram of a design flow process for designing integrated circuits.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 comprises circuit 100 in the form of schematics or HDL, a hardware-description language (e.g., Verilog, VHDL, C, etc.). Design structure 820 may be contained on one or more machine readable medium. For example, design structure 820 may be a text file or a graphical representation of circuit 100. Design process 810 preferably synthesizes (or translates) circuit 100 into a netlist 880, where netlist 880 is, for example, a list of wires, transistors, logic gates, control circuits, I/O, models, etc. that describes the connections to other elements and circuits in an integrated circuit design and recorded on at least one of machine readable medium. This may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Ultimately, design process 810 preferably translates circuit 100, along with the rest of the integrated circuit design (if applicable), into a final design structure 890 (e.g., information stored in a GDS storage medium). Final design structure 890 may comprise information such as, for example, test data files, test data structures, design content files, manufacturing data, layout parameters, wires, levels of metal, vias, shapes, test data, data for routing through the manufacturing line, and any other data required by a semiconductor manufacturer to produce circuit 100. Final design structure 890 may then proceed to a stage 895 where, for example, final design structure 890: proceeds to tape-out, is released to manufacturing, is sent to another design house or is sent back to the customer.

The above description and drawings are only to be considered illustrative of exemplary embodiments, which achieve the features and advantages of the invention. The embodiments are not limited to circuitry but can be implemented where it would be useful to have any type of hardware generate its own identification for other functional purposes and operations. For example, the invention could be implemented on medical devices, provide self-identification for satellites, or even provide unique identifiers for processors in an automobile. It should be appreciated by one of ordinary skill in the art that modification and substitutions to specific logic elements, test methods, addressing methods, modes of operation, enabling schemes, and functional utility can be made without departing from the spirit and scope of the invention. Accordingly, the invention is not to be considered as being limited by the foregoing description and drawings.

What is claimed is:

1. A structure comprising:
   a controller (110) and at least one logic element (e.g. 120a);
   the controller comprising
   a first register (210) coupled to a first decoder (230), a first counter (220), and the logic element;
   the logic element comprises a second counter (320), the second counter (320) increments when enabled by the controller and stores a value corresponding to the last count when the second counter is disabled by the controller;
   the first counter comprises a count corresponding to a number of instances of the logic element in a system.

2. The structure of claim 1 further comprising a plurality of logic elements, each coupled in succession to at least one other of the plurality of logic elements, and each comprising a stored value.

3. The structure of claim 2, wherein the stored value for each of the plurality of logic elements is the same.

4. The structure of claim 2, wherein the stored value for each of the plurality of logic elements is different.

5. The structure of claim 2, wherein each of the logic elements further comprises a device (340) adapted to accept an input from one of the logic elements and to propagate a signal to the input of a subsequently coupled logic element.

6. The controller of claim 1 further comprising:
   a second register (420) coupled to the first decoder and a first enable logic (440);
   wherein the first enable logic enables the second register according to an instruction from the first decoder.

7. The logic element of claim 1, further comprising a third register (520) enabled by a second enable logic (530), the second enable logic further coupled to the second counter and the second decoder.

8. A method for enabling an enumeration operation by a controller, comprising:
   loading a first instruction in a first register (210);
   decoding the first instruction in a first decoder (230);
   asserting a first signal (BEXE) in accordance with the first instruction;
   incrementing a first counter (220) until a second signal is asserted (DONEIN);
   storing a first value in the first counter, the first value being representative of the number of one or more logic elements (120)
   loading the first instruction in a second register (310);
   decoding the first instruction in a second decoder (330);
   incrementing a second counter (320) until the second signal is asserted (DONEIN); and
   storing a second value in the second counter, the second value being representative of an identifier for the logic element.

9. The method of claim 8 further comprising:
   loading a second instruction into the second register;
   decoding the second instruction in the second decoder;
   asserting an enable signal in accordance with the second instruction;
   comparing the second value to a portion of the second instruction to determine whether the second instruction applies to the logic element;
   enabling a third register (520) in accordance with the enable signal; and executing the second instruction if the second instruction applies.

10. The method of claim 8 further comprising:
loading a third instruction into the second register;
decoding the third instruction in the second decoder;
comparing the second value to a portion of the third instruction to determine whether the third instruction applies to the logic element and if so performing a first test (700) of a first circuit under test (e.g. 130*a*) coupled to the logic element.

11. A design structure embodied in a machine readable medium, the design structure comprising:
a controller (110) and at least one logic element (e.g. 120*a*); the controller comprising
a first register (210) coupled to a first decoder (230), a first counter (220), and the logic element;
the logic element comprises a second counter (320), the second counter increments when enabled by the controller, and stores a value corresponding to an identifier for the logic element when the second counter is disabled by the controller;
the first counter comprises a count corresponding to a number of instances of the logic element in a system.

12. The design structure of claim 11 further comprising a plurality of logic elements, each coupled in succession to at least one other of the plurality of logic elements, and each comprising its identifier.

13. The design structure of claim 12, wherein each of the logic elements further comprises a device (340) adapted to accept an input from one of the logic elements and to propagate a signal to the input of a subsequently coupled logic element (e.g. 120*b*).

14. The design structure of claim 11, wherein the controller further comprises:
a second register (420) coupled to the first decoder (230) and a first enable logic (440);
wherein the first enable logic enables the second register according to an instruction from the first decoder.

15. The design structure of claim 11, wherein the logic element further comprises a third register (520) enabled by a second enable logic (530), the second enable logic further coupled to the second counter and the second decoder.

16. The design structure of claim 11, wherein the design structure is embodied in a GDS storage medium.

17. The design structure of claim 11 further comprising:
at least one test data structure (885) for testing at least one circuit under test (e.g. 130*a*), wherein the circuit under test is coupled to the logic element and the test data structure comprises the identifier corresponding to the logic element.

* * * * *